United States Patent
Kozawa et al.

(10) Patent No.: US 6,891,203 B2
(45) Date of Patent: May 10, 2005

(54) LIGHT EMITTING DEVICE

(75) Inventors: Takahiro Kozawa, Aichi (JP); Naoki Shibata, Aichi (JP)

(73) Assignee: Toyoda Gosei Co., Ltd., Aichi (JP)

( * ) Notice: Subject to any disclaimer, the term of this patent is extended or adjusted under 35 U.S.C. 154(b) by 4 days.

(21) Appl. No.: 10/250,772

(22) PCT Filed: Jan. 4, 2002

(86) PCT No.: PCT/JP02/00003

§ 371 (c)(1),
(2), (4) Date: Jul. 9, 2003

(87) PCT Pub. No.: WO02/056391

PCT Pub. Date: Jul. 18, 2002

(65) Prior Publication Data

US 2004/0061115 A1 Apr. 1, 2004

(30) Foreign Application Priority Data

Jan. 10, 2001 (JP) .................................... P2001-003104
Nov. 16, 2001 (JP) .................................... P2001-352376

(51) Int. Cl.$^7$ ............................................. H01L 29/24
(52) U.S. Cl. ...................................... 257/102; 257/103
(58) Field of Search ................................ 257/102–103

(56) References Cited

U.S. PATENT DOCUMENTS

| 5,813,752 | A |   | 9/1998  | Singer et al.   |         |
|-----------|---|---|---------|-----------------|---------|
| 5,994,722 | A |   | 11/1999 | Averbeck et al. |         |
| 5,998,925 | A | * | 12/1999 | Shimizu et al.  | 313/503 |
| 6,084,250 | A |   | 7/2000  | Justel et al.   |         |
| 6,396,082 | B1 | * | 5/2002 | Fukasawa et al. | 257/79  |
| 6,501,084 | B1 | * | 12/2002| Sakai et al.    | 250/504 R |

FOREIGN PATENT DOCUMENTS

| JP | 5-152609    | 6/1993  |
| JP | 10-22527    | 1/1998  |
| JP | 10-144961   | 5/1998  |
| JP | 2000-196142 | 7/2000  |
| JP | 2000-216434 | 8/2000  |
| JP | 2000-349340 | 12/2000 |

* cited by examiner

Primary Examiner—Allan R. Wilson
(74) Attorney, Agent, or Firm—McGinn & Gibb, PLLC

(57) ABSTRACT

According to the invention, a Group III nitride compound semiconductor light-emitting element is provided with a light-emitting layer comprising two layers of different in ratio of AlGaInN composition, and emitting light with an emission peak wavelength in an ultraviolet region and light with an emission peak wavelength in a visible region. The light-emitting element and a fluorescent material excited by light in the ultraviolet region are combined to configure a light emitting device.

10 Claims, 2 Drawing Sheets

LIGHT EMITTING DEVICE

TECHNICAL FIELD

The present invention relates to a light emitting device. In particular, the present invention relates to a light emitting device which is made by a combination of a Group III nitride compound semiconductor light-emitting element and a fluorescent material, and converts a part of light emitted from the light-emitting element by the fluorescent material to thereby emit light.

BACKGROUND ART

There has been proposed a light emitting device which changes wavelength of a part of light from the light-emitting element by the fluorescent material, and mixes the light which has been subjected to wavelength conversion and the light from the light-emitting element, thereby enabling to emit a color different from an emission light color of the light-emitting element itself. For example, a light emitting device which has a structure where a light-emitting element for emitting blue light and a fluorescent material excited by the blue light to thereby emit light with wavelength larger than that of the blue light are combined has been known.

The above existing light emitting device uses the blue light, that is, light in a visible region as an excitation light of the fluorescent material. Herein, excitation efficiency or light-emitting efficiency of the fluorescent material varies according to the wavelength of the excitation light. In general, in the case of using the light in the visible region as the excitation light, the excitation efficiency is decreased. Accordingly, the above light emitting device is low in the excitation efficiency of the fluorescent material, and it cannot convert at high efficiency the wavelength of the light from the light-emitting element to radiate it outside. In addition, when the excitation efficiency of the fluorescent material is low, loss of the blue light of the light-emitting element is made large, and the quantity of the blue light which has not been subjected to wavelength conversion and radiated outside is made smaller. As seen in the conventional structure, not only the quantity of the light obtained by converting light from the light-emitting element in wavelength but the quantity of the light emitted from the light-emitting element and directly radiated outside is reduced. Consequently, total light output power (luminance) of the light emitting device decreases as a whole.

The invention has been made in view of the above problems. It is an object of the invention to provide a light emitting device which uses a single light source (light-emitting element) and can emit, at high efficiency, light of color different from an emission light color of the light-emitting element itself. In particular, the invention aims to provide a light emitting device which can emit, at high efficiency, white light or light with mixed color of lights of two or more wavelengths.

DISCLOSURE OF THE INVENTION

In view of the above problems, inventors of the present inveniton made many studies on various improvements as to light-emitting elements employing Group III nitride compound semiconductor as materials of a light-emitting layer, and developed a light-emitting element which can emit light with an emission peak wavelength in an ultraviolet region and light with an emission peak wavelength in a visible region respectively. The invention has been based on the above studies, and has a structure as follows. That is, a light emitting device has a light-emitting element comprising the Group III nitride compound semiconductor, and having a light-emitting layer emitting light with an emission peak wavelength in an ultraviolet region and light with an emission peak wavelength in a visible region; and a fluorescent material excited by the light in the ultraviolet region to emit light with a wavelength different from that of an excitation light.

In the above light emitting device, the fluorescent material is excited by the light in the ultraviolet region emitted by the light-emitting element and emits light. And the light by such emission and the light in the visible region emitted by the light-emitting element are mixed and radiated outside. Herein, since the light in the ultraviolet region emitted by the light-emitting element is utilized for exciting the fluorescent material, the fluorescent material can be excited at high efficiency and emission at high luminance can be obtained from the fluorescent material. On the other hand, the light in the visible region is emitted from the light-emitting element, and this light is not absorbed by the fluorescent material but radiated outside. Accordingly, the light in the visible region emitted by the light-emitting element can be utilized as externally radiating light without loss.

As mentioned above, by adopting a structure of using the light-emitting element emitting light in the ultraviolet region and light in the visible region and utilizing the light in the ultraviolet region for exciting the fluorescent material, the emission of high luminance can be obtained from the fluorescent material, and at the same time, the light of the light-emitting element can be suppressed from loss. That is, a light emitting device is provided, which utilizes the light of the light-emitting element at high efficiency and has high emission efficiency.

BEST MODE FOR CARRYING OUT THE INVENTION

Figure 1:
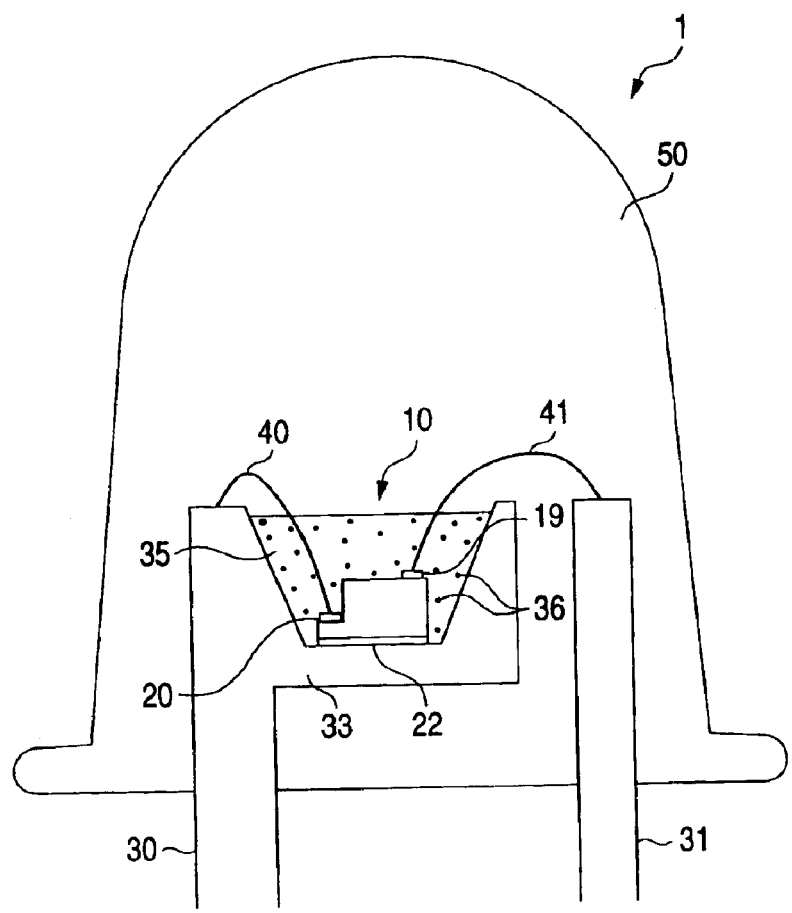
FIG. 1 is a view showing a structure of a white LED 1 as one embodiment of the invention.

The light-emitting element of the invention has a light-emitting layer comprising the Group III nitride compound semiconductor, and emitting light with an emission peak wavelength in the ultraviolet region and light with an emission peak wavelength in the visible region. That is, as to the emission wavelength, the light-emitting element uses the light-emitting layer having respectively at least one emission peak in the ultraviolet region and at least one emission peak in the visible region. As far as the light-emitting layer satisfies this condition, it is possible to use the light-emitting layer having two or more emission peaks in the ultraviolet region, and to use the light-emitting layer having two or more emission peaks in the visible region.

The light in the ultraviolet region must be able to excite a fluorescent material described hereinafter, preferably the light has the wavelength which can excite the fluorescent material at high efficiency. Accordingly, the light preferably has the emission peak wavelength in the vicinity of the excitation wavelength of the fluorescent material; and more preferably, the light has a single emission peak wavelength in the vicinity of the excitation wavelength of the fluorescent material. For example, the light in the ultraviolet region has the emission peak in a range of 360 nm or less, in particular, in a range of 340 to 360 nm.

The light in the visible region is mixed with a light emitted from fluorescent material described hereinafter and released. Namely, according to the light emitting device of the invention, there is obtained an emission of a mixed color of light in the visible region emitted from the light-emitting layer of the light-emitting element and light from the fluorescent material. Therefore, a color (wavelength) of the light in the visible region can be appropriately selected, taking a color (wavelength) of the light from the fluorescent material and a color (wavelength) of the light from the light emitting device into consideration. In other words, by changing the color (wavelength) of the light in the visible region, an emission light color of the light emitting device can be changed.

Specifically, the emission peak wavelength of the light in the visible region can be set in a range of from 430 to 560 nm. Otherwise, the emission peak wavelength can be set in a range of from 450 to 490 nm. The light in such a visible region has a blue color. By using the fluorescent material with light emission of yellow or yellowish green, the light emitting device emitting white color may be configured.

The light-emitting layer is formed with a material of Group III nitride compound semiconductor. Herein, the Group III nitride compound semiconductors are represented by a general formula for quaternary compounds $Al_xGa_yIn_{1-x-y}N$ ($0 \leq X \leq 1$, $0 \leq Y \leq 1$, $0 \leq X+Y \leq 1$), which includes so-called binary compounds such as AlN, GaN and InN, and so-called ternary compounds such as $Al_xGa_{1-x}N$, $Al_xIn_{1-x}N$ and $Ga_xIn_{1-x}N$ ($0<x<1$). The Group III elements may be partially replaced by boron (B), thallium (Tl), etc. The nitrogen (N) may be partially replaced by phosphorus (P), arsenic (Ar), antimony (Sb), or bismuth (Bi), etc. In addition, the light-emitting layer may contain any optional dopant.

In one example forming the light-emitting layer with the quaternary compound, the light-emitting layer has a region composed of $Al_{x1}Ga_{1-x1-x2}In_{x2}N$ ($0<x1<1$, $0<x2<1$, $x1>x2$) and a region composed of $Al_{y1}Ga_{1-y1-y2}In_{y2}N$ ($0<y1<1$, $0<y2<1$, $y1<y2$). Since the former region contains a large amount of Al in the composition, a band gap is made comparatively larger, and this region can emit light with comparatively short emission wavelength in the ultraviolet region. On the other hand, since the latter region contains plenty of In in the composition, the band gap is made comparatively smaller, and this region can emit light with comparatively long emission wavelength in the visible region. Both regions are desirably formed within a single layer in the state of the mixed crystal. In the case of forming the light-emitting layer with the ternary compound, it is possible to adopt the light-emitting layer having the region of $Al_xGa_{1-x}N$ ($0 \leq x \leq 1$) emitting the light in the ultraviolet region and the region of $In_yGa_{1-y}N$ ($0 \leq y \leq 1$) emitting the light in the visible region. Also in this case, both regions are desirably formed within the single layer in the state of the mixed crystal.

The aforementioned light-emitting layer may be formed by, for example, a metal organic chemical vapor deposition method (referred as "MOCVD method" hereafter) as later exemplified. In general, to form the light-emitting layer of the Group III nitride compound semiconductor through the MOCVD method, an ammonia gas and Group III element alkyl compound gases such as trimethyl gallium (TMG), trimathyl aluminium (TMA), or trimethyl indium (TMI) are supplied to an MOCVD apparatus heated to a predetermined temperature and are subjected to thermal decomposition reaction. By adjusting the growth conditions of the light-emitting layer such as growth temperature, flow rate of ammonia gas, ratio and flow rate of alkyl compound gases, ratio between flow rate of ammonia gas and flow rate of alkyl compound gases, and growth rate, the light-emitting layer composed of the above-mentioned mixed crystal can be formed.

According to the inventors' investigations, under conditions where the ratio of raw gases to be supplied fall in the range of TMG:TMA:TMI=1:0.01:0.05 to 1:0.05:10, in the range of ammonia gas:raw gases of Group III elements (TMG, TMA, TMI)=1000:1 to 100000:1, in the growth temperature range of 600° C. to 1100° C., and by the growth rate of 0.002 to 1 $\mu$m/min, it is possible to grow the light-emitting layer composed of mixed crystals $Al_{x1}Ga_{1-x1-x2}In_{x2}N$ ($0<x1$, $0<x2<1$, $x1>x2$), and $Al_{y1}Ga_{1-y1-y2}In_{y2}N$ ($0<y1<1$, $0<y2<1$, $y1<y2$) with good crystallinity. Preferably, the light-emitting layer is grown in the range of TMG:TMA:TMI=1:0.02:0.4 to 1:0.2:2, in the range of ammonia gas:raw gases of Group III elements (TMG, TMA, TMI)=5000:1 to 80000:1, in the range of the growth temperature of 700° C. to 900° C., and in the range of the growth rate 0.01 to 1 $\mu$m/min.

By adjusting the growth conditions of the light-emitting layer appropriately, it is possible to form the light-emitting layer having different ratio between the range of $Al_{x1}Ga_{1-x1-x2}In_{x2}N$ ($0<x1<1$, $0<x2<1$, $x1>x2$) and the range of $Al_{y1}Ga_{1-y1-y2}In_{y2}N$ ($0<y1<1$, $0<y2<1$, $y1<y2$). Similarly, in the case of forming a light-emitting layer with the ternary compound, by adjusting the growth conditions appropriately, it is possible to form the light-emitting layer having different ratio between the range of $Al_xGa_{1-x}N$ ($0 \leq x \leq 1$) and the region of $In_yGa_{1-y}N$ ($0 \leq y \leq 1$).

The structure of the light-emitting layer is not especially limited, but a single quantum well structure or a multiple quantum well structure may be employed.

The forming process of the light-emitting layer is not limited to the MOCVD method. The light-emitting layer may be formed of well-known methods such as molecular beam epitaxy method (MBE method), halide vapor phase epitaxy method (HVPE method), sputtering method, ion-plating method, or electron shower method.

The fluorescent material is excited by the light in the ultraviolet region emitted from the light-emitting element, and emits light different in wavelength from the excitation light. Accordingly, if the fluorescent material enables to be excited by the light of the ultraviolet region emitted from the light-emitting element, it can be employed as the fluorescent material according to the invention. For example, any of, or two or more selected from ZnS:Cu, Al; (Zn, Cd) S:Cu, Al; ZnS:Cu, Au, Al; $Y_2SiO_5$:Tb, (Zn, Cd) S:Cu; $Gd_2O_2S$:Tb, $Y_2O_2S$:Tb; $Y_3Al_5O_{12}$:Ce; (Zn, Cd) S:Ag; ZnS:Ag, Cu, Ga, Cl; $Y_3Al_5O_{12}$:Tb; $Y_3$ (Al, $Ga)_5O_{12}$:Tb; $Zn_2SiO_4$:Mn; $LaPO_4$:Ce, Tb; $Y_2O_3S$:Eu; $YVO_4$:Eu; ZnS:Mn; $Y_2O_3$:Eu; ZnS:Ag; ZnS:Ag, Al; (Sr, Ca, Ba, $Mg)_{10}(PO_4)_6Cl_2$:Eu; $Sr_{10}(PO_4)_6Cl_{12}$:Eu; (Ba, Sr, Eu) (Mg, $Mn)Al_{10}O_{17}$; (Ba, Eu)$MgAl_{10}O_{17}$, ZnO:Zn; $Y_2SiO_5$:Ce may be combined to use.

The fluorescent material emitting the light of high luminance by irradiation of the excitation light emitted from the light-emitting element is desirably used. The light emitted from the fluorescent material is mixed with the light in the visible region from the light-emitting element and released outside. That is, the emission color of the fluorescent material is a factor determining an emission color as a whole of the light emitting device, and accordingly, such a fluorescent material is selected for realizing a light emitting device of desired emission colors. For example, in a case where visible light from the light-emitting element is blue, by adopting the fluorescent material having emission color of yellow or yellowish green, it is possible to obtain emission of white as the whole of the light emitting device. For example, as the fluorescent materials having the emission color of yellow or yellow green groups, available are ZnS:Cu, Al, (Zn, Cd) S:Cu, Al; ZnS:Cu, Au, Al; $Y_2SiO_5$:Tb, (Zn, Cd) S:Cu; $Gd_2O_2S$:Tb, $Y_2O_2S$:Tb; $Y_3Al_5O_{12}$:Ce; (Zn, Cd) S:Ag; ZnS:Ag, Cu, Ga, Cl; $Y_3Al_5O_{12}$:Tb; $Y_3$ (Al, $Ga)_5O_{12}$:Tb; $Zn_2SiO_4$:Mn; $LaPO_4$:Ce, Tb.

Incidentally, the fluorescent material may have the excitation wavelength also to the visible light emitted from the light-emitting element.

The fluorescent material (a second fluorescent material) excited by the visible light emitted from the light-emitting element and being able to emit light having a different wavelength from that of the excitation light can also be combined with the above-mentioned fluorescent material. Thereby, the emission from the second fluorescent material is utilized to compensate emission color of the light emitting device.

It is known that yellow light is emitted when an n-type GaN layer doped with n-type impurities such as Si, S, Se, Te, or Ge is irradiated by the light in the ultraviolet region. By making use of the light emission obtained from the n-type GaN layer, the emission color of the light emitting device of the invention can be compensated. Further, in the case where the emission of high luminance can be obtained from the n-type GaN layer, by making use of such emission, it is possible to omit the above-mentioned fluorescent materials and obtain the emission of the light emitting device by color mixture of the light from the n-type GaN layer and the visible light from the light-emitting element. Of course, also in this case, the above-mentioned fluorescent materials can be used together.

The fluorescent material is disposed in the light-emitting direction of the light-emitting element. The fluorescent material is desirably dispersed into a light transmitting material and used. In this case, preferably, the light emitting device has a structure shielding the light emitting direction of the light-emitting element by means of the light transmitting material (referred as "fluorescent material" hereafter) dispersed with the fluorescent material for efficiently irradiating the light from the light-emitting element to the fluorescent material. For example, the fluorescent material may be formed in a layer shape on the surface of the light-emitting element. As seen in the embodiment hereinafter described, when mounting the light-emitting element on a cup shaped portion in a lead frame, etc., the fluorescent material can be filled in the cup shaped portion. Further, the fluorescent material can be used as a sealing member. A structure including the light-emitting element may be sealed by the fluorescent material.

As the light transmitting material, epoxy resin, silicone resin, urea resin or glass are used. These materials may be of course solely served, and more than two kinds arbitrarily selected from them may be also served.

In response to using purposes or conditions, density distribution of the fluorescent material in the light transmitting material can be changed. That is, as coming nearer to the light-emitting element, the amount of the fluorescent material is changed successively or stepwise. For example, at the part near the light-emitting element, the density of the fluorescent material may be made larger. Under this structure, it is made possible to efficiently irradiate the light from the light-emitting element to the fluorescent material. As coming nearer to the light-emitting element, the density of the fluorescent material may be made smaller. Under this structure, it is made possible to suppress the fluorescent material from deteriorating caused due to the heat of the light-emitting element.

Between the fluorescent material and the light-emitting element, a layer of the light transmitting material or a space may be provided.

In the case of the structure for passing the light from the light-emitting element through the fluorescent material (the light in the ultraviolet region excites the fluorescent material and makes it emit), the light in the visible region from the light-emitting element and the light from the fluorescent material are automatically mixed. But the mixture is not limited to this embodiment. For example, the fluorescent materials are arranged in like islands around the light-emitting element. At the same time the light of the ultraviolet region from the light-emitting element is irradiated to the fluorescent materials, the light of the visible region is passed among the islands of the fluorescent materials, so that the light of the visible region from the light-emitting element and the light from the fluorescent material can be mixed within the sealing member. In the above-mentioned case, the fluorescent material and the light-emitting element are unified to compose the light emitting device, but the light emitting device may be composed as a separate body where the fluorescent material is independent of the light-emitting element. For example, an LED is composed by use of the light-emitting element of the above-mentioned structure, and is joined with the light transmitting material (a light transmitting film containing the fluorescent material, or cap) to make the light emitting device.

The light emitting device of the invention may be used solely as a light source emitting the white light. Further, it is assumed to utilize this device to a light emitting diode display (called as "LED display" hereafter) displaying the white color at high density and high precision. In the conventional LED display capable of displaying full color, respective LEDs of R, G, B are combined to make one pixel, and each of those are emitted and liht of each LED are mixed to produce the white emission. Namely, for the white display, emission of three LEDs are necessary, and comparing with monochrome emission such as green, red, etc., the display area is made enlarged, and therefore white color cannot be displayed at high precision as similar to the green, etc.

The light emitting device of the invention can realize the white emission solely. Therefore, by additionally using the light emitting device of the invention to the respective LEDs of RGB, the white display can be obtained at high density and high precision as the green or red emission. Further, the light emitting device of the invention has also a merit of adjusting the white display by controlling lighting conditions of one light-emitting element, and since it does not perform the white display through the mixture of the emission colors of the respective LEDs of RGB as conventionally, visual colors are not changed depending on the viewing angle, and variation in color can be decreased. In addition, when being used together with the respective LEDs of RGB, by performing the white display by mixture of color of RGB and the white display by the light emitting device of the invention simultaneously, luminous intensity and luminance in the white display can be heightened.

In the following, taking up, as one example, the light emitting device (LED) being one embodiment of the invention, the structure of the invention will be explained in more detail.

Figure 2:
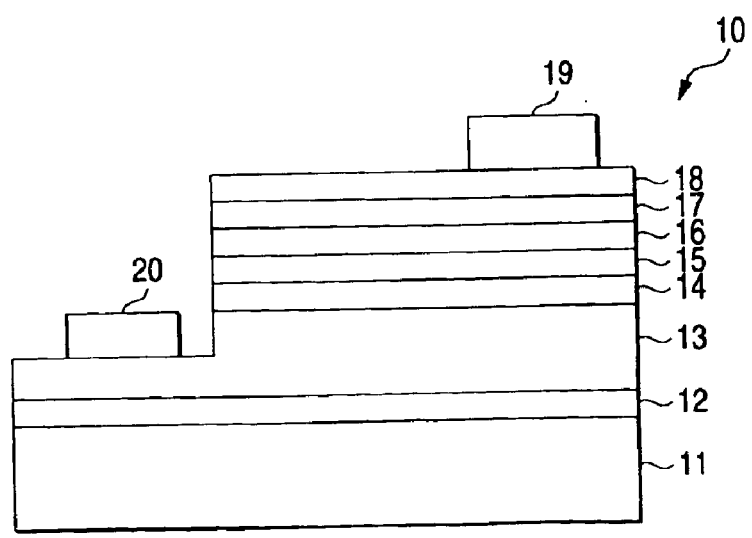
FIG. 2 is a view showing a structure of the light-emitting element 10 to be used to LED 1.

FIG. 1 is a view showing a structure of a white LED 1 as one embodiment of the invention. FIG. 2 is a cross sectional view of the light-emitting element 10 to be used to LED 1.

The specification of the respective layers of the light-emitting element 10 is as follows.

Layer: Composition: Dopant
Light-transmitting electrode 18: Au/Co
First p-type layer 17: p-AlGaN:Mg
Second p-type layer 16: p-AlGaN:Mg
Layer 15 including a light-emitting layer: Multiple quantum well structure
Quantum well layer: AlInGaN
Barrier layer: GaN
Second n-type layer 14: n-AlGaN:Si
First n-type layer 13: n-GaN:Si
Buffer layer 12: AlN
Substrate 11: Sapphire The material of the substrate 11 is not limited to the specific one so long as the Group III nitride compound semiconductors can be grown on the substrate. Spinel, silicon, silicon carbide, zinc oxide, gallium phosphide, gallium arsenide, magnesium oxide, manganese oxide, or single crystal of Group III nitride compound semiconductor can be used other than sapphire. When using the sapphire substrate, its a face is preferably used.

The buffer layer 12 is used for growing the semiconductor layer of high quality, and is formed on the surface of a substrate 11 through a known MOCVD method, etc. In the present embodiment, AlN is used as the buffer layer, but no limitation is made thereto, and the binary compounds such as GaN and InN, the Group III nitride compound semiconductors (ternary compounds) generally represented by $Al_xGa_yN$ (0<x<1, 0<y<1, x+y=1), and the Group III nitride compound semiconductors (quaternary compounds) generally represented by $Al_aGa_bIn_{1-a-b}N$ (0<a<1, 0<b<1, a+b<1).

The respective semiconductor layers are formed by the known MOCVD method. In this growing process, an ammonia gas and Group III alkyl compound gas such as trimethyl gallium (TMG), trimathyl aluminium (TMA), or trimethyl indium (TMI) are supplied on the substrate heated to an appropriate temperature and subjected to thermal decomposition reaction to thereby grow desired crystals on the buffer layer 12. Of course, the forming process of the respective semiconductor layers is not limited thereto. The layers may be formed by well-known methods such as molecular beam epitaxy method (MBE method), halide vapor phase epitaxy method (HVPE method), sputtering method, ion-plating method, or electron shower method. The Group III nitride compound semiconductor may include an optional dopant. As the n-type impurities, Si, Ge, Se, Te or C may be used, and as the p-type impurities, Mg, Zn, Be, Ca, Sr, or Ba may be used. After having doped the p-type impurities, the Group III nitride compound semiconductor may be exposed to irradiation of electron beam, plasma irradiation, or heating by a furnace.

In this embodiment, the layer 15 including the light-emitting layer was formed as follows. At first, the temperature of the substrate was set at 830° C., and TMG and the ammonia gas were supplied into the MOCVD apparatus, to thereby form the barrier layer (GaN). Subsequently, while keeping the temperature of the substrate, the quantum well layer (AlInGaN) was formed by the raw gases of ammonia gas, TMG, TMA and TMI. By repeating the above-mentioned operations by the predetermined number, the layer 15 including the light-emitting layer where the desired number of barrier layers and the quantum well layers are laminated was obtained.

The structure of the light-emitting element may be a single hetero type, a double hetero type and a homo junction type.

Between the layer 15 including the light-emitting layer and a p-clad layer 16, an $Al_xGa_yIn_{1-x-y}N$ (0≦X≦1, 0≦Y≦1, X+Y≦1) layer doped with an acceptor such as magnesium and having a wide band cap may be interposed to prevent electrons injected into the layer 15 including the light-emitting layer from diffusing in the p-clad layer 16.

An n-electrode 20 is composed of two layers of Al and V. After forming a p-contact layer 17, the p-contact layer 17, the p-clad layer 16, the layer 15 including the light-emitting layer, the n-clad layer 14, and the n-contact layer 13 are partially removed by etching, and then the n-electrode 20 is formed on the n-contact layer 13 by vapor deposition.

The light-transmitting electrode 18 is a thin film including gold and is formed substantially all over the upper surface of the p-contact layer 17. The p-electrode 19 is formed on the translucent electrode 18 via the vapor deposition.

Figure 3:
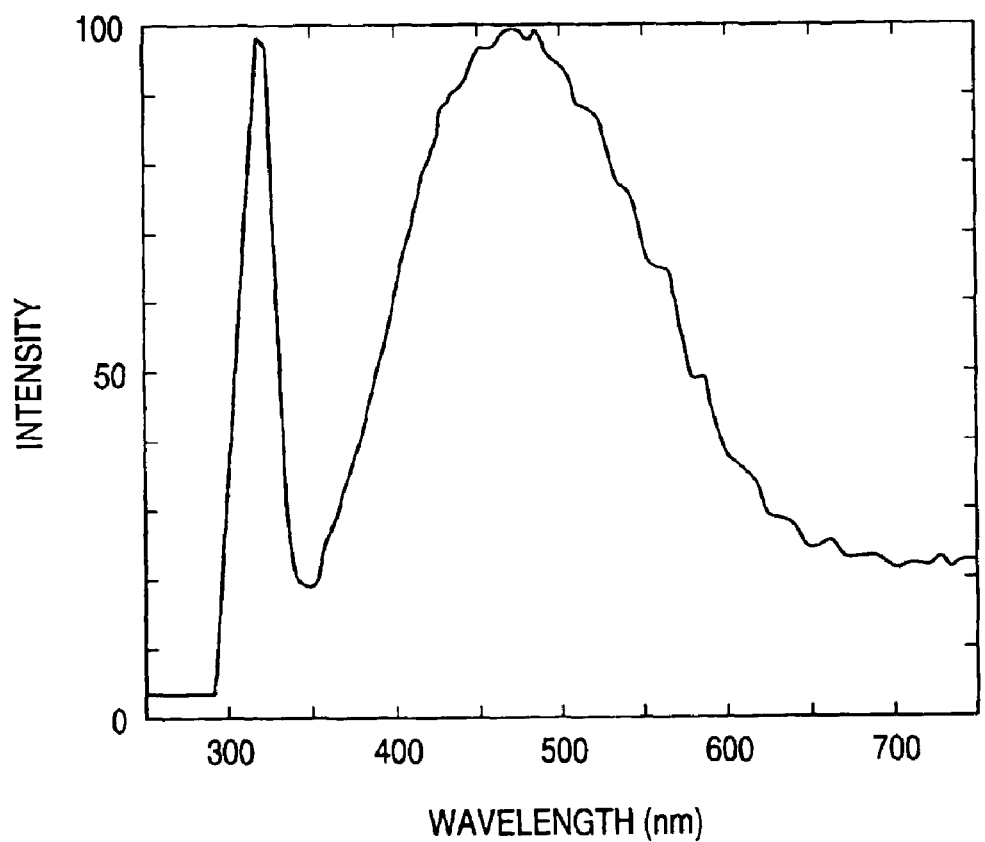
FIG. 3 is a graph showing an emission spectrum of the light-emitting element 10.

After the above-mentioned processes, the substrate is separated into each chip. The emission spectrum of the obtained light-emitting element 10 was measured. FIG. 3 shows a measured result under the applied voltage 3.4V and the current in the forward direction 20 mA. As shown in FIG. 3, in the vicinity of the wavelengths 330 nm and 470 nm, two emission peaks are observed.

Between the substrate 15 including the light-emitting layer and the substrate 11, or on a surface of the substrate 11 where the semiconductor layer is not formed, a reflecting layer may be provided, thereby being capable of efficiently reflecting light generated in the layer 15 including the light-emitting layer and traveling to the substrate side to a light extracting direction. As a result, light emitting efficiency can be improved. Metallic nitrides such as titanium nitride, zirconium nitride, hafnium nitride, and tantalum nitride, a single metal selected from the group consisting of Al, In, Cu, AgI, Pt, Ir, Pd, Rh, W, Mo, Ti, and Ni, or an alloy composed of at least two metals optionally selected from the group may be used as a raw material of the reflecting layer.

Next, the LED 1 was made by use of the light-emitting element 10 as follows.

At first, the light-emitting element 10 was mounted in the cup portion 33 formed in the lead frame 30 via an adhesive agent 22. The adhesive agent 22 is a silver paste formed by mixing silver as a filler into an epoxy resin. By using such a silver paste, heat is smoothly radiated from the light-emitting element 10.

The cup portion 33 is filled with the epoxy resin 35 (called as "fluorescent material resin" hereafter) uniformly dispersed with the fluorescent material 36. The fluorescent material resin may be charged in the cup portion 33 after wire-bonding hereinafter described. Otherwise, a layer composed of the fluorescent material resin is formed on a surface of the light-emitting element 10 before mounting the light-emitting element 10 on the cup portion 33. For example, by dipping the light-emitting element 10 in the fluorescent material resin, the layer of the fluorescent material resin is formed on the surface of the light-emitting element 10, and subsequently, the light-emitting element 10 is mounted in the cup portion 33 by use of the silver paste. A manner of forming the layer of the fluorescent material resin may include, other than the dipping, spattering, coating, or painting.

For the fluorescent material 36, ZnS:Cu, Au, and Al (trade name P22-GY made by Kasei Optnics Co., Ltd., the emission peak:535 nm) were used. In this embodiment, the epoxy resin was used as a base material for dispersing the fluorescent material 36, but no limitation is made thereto, and available are silicone resin, urea resin or transparent material as a glass. The embodiment has a structure of uniformly dispersing the fluorescent material 36 into the fluorescent material resin 35, but the density distribution of the fluorescent material 36 may be graded in the fluorescent material resin 35. For example, by use of epoxy resins being different in the density of the fluorescent material 36, a plurality of the layers of the fluorescent material resins being different in the density of the fluorescent materials 36 are formed within the cup portion 33. The density of the fluorescent material 36 may be changed continuously.

The fluorescent material resin 35 may contain a dispersing agent composed of titanium oxide, titanium nitride, tantalum nitride, aluminum oxide, silicon oxide, or barium titanate.

By containing the fluorescent material 36 in a sealing resin 50 described hereinafter, the fluorescent material resin 35 may be omitted. That is, in this case, also within the cup portion 33, the sealing resin 50 is filled. Further, as similar to the fluorescent material resin 35 as aforementioned, the density distribution of the fluorescent material 36 may be graded.

The p-electrode 19 and the n-electrode 20 are respectively wire-bonded to the lead frames 31 and 30 via wires 41 and 40.

Thereafter, the light-emitting element 10, parts of the lead frames 30, 31 and the wires 40, 41 are sealed by the sealing resin 50 of epoxy resin. As far as materials of the sealing resin 50 are transparent, no especial limitation is made, and other than epoxy resin, silicone resin, urea resin, or glass may be suitably used. In view of adhesion with or refractive index of the fluorescent material resin 35, the sealing resin 50 is preferably composed with the same materials as those of the fluorescent material resin 35.

The sealing resin 50 is provided for a purpose of protecting a structure of the element. And lens effect can be imparted to the sealing resin 50 by changing the shape of the sealing resin 50 in accordance with the purpose. For example, other than a round type shown in FIG. 1, the sealing resin may be shaped in a concave lens, or a convex lens. The sealing resin 50 may be shaped in circle, oval, or rectangle when seen from the light extracting direction (the upper side in FIG. 1).

An interior of the sealing resin 50 may be dispersed with the fluorescent material 36 not only in the case of omitting the fluorescent material resin 35. Further, when another fluorescent material different from the above-mentioned fluorescent material 36 is dispersed in the sealing resin, it is made possible to compensate and change the emission color of LED 1 by utilizing the emission of such another fluorescent material.

In addition, the dispersing agent can be contained in the sealing resin 50. By use of the dispersing agent, directivity of the light from the light-emitting element 10 is moderated. As the dispersing agent, available are titanium oxide, titanium nitride, tantalum nitride, aluminum oxide, silicon oxide, or barium titanate.

A coloring agent can be contained in the sealing resin 50. The coloring agent is used to prevent the fluorescent material from exhibiting the peculiar color when the light-emitting element 10 is turned on or turned off.

In addition, the life of the device can be prolonged by containing an ultraviolet absorbent in the sealing resin 50.

The fluorescent material 36, the dispersing agent, coloring agent and the ultraviolet absorbent can be solely contained in the sealing resin 50, alternatively, two or more selected among from them can be contained in the sealing resin 50.

Other light-emitting elements can be used together with the abovementioned light-emitting element 10. As the other light-emitting elements, a light-emitting element which has a different wavelength from that of the light-emitting element 10 may be used. Preferably, a light emitting-element which hase an emission wavelength substantially neither exciting the fluorescent material nor making it emit. By using such another light-emitting element, the light emitting device can emit another color than the white. In addition, luminance can be enhanced by using a plurality of light-emitting elements 10.

Figure 4:
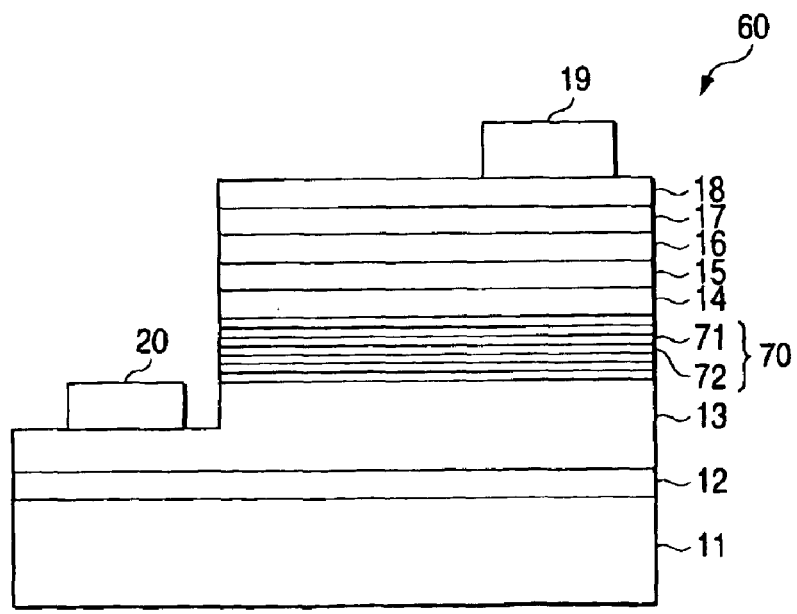
FIG. 4 is a view showing the structure of the light-emitting element 60 used to the light emitting device of another embodiment of the invention.

Next, another embodiment of the invention will be explained. FIG. 4 is a view schematically showing the structure of the light-emitting element 60 used to the light emitting device of another embodiment of the invention. In the light-emitting element 60, the same elements as those of the above mentioned light-emitting element 10 will be given the same numerals to omit explanations therefore.

The specification of the respective layers of the light-emitting element 60 is as follows.

Layer: Composition: Dopant
Light transmitting electrode 18: Au/Co
First p-type layer 17: p-AlGaN:Mg
Second p-type layer 16: p-AlGaN:Mg
Layer 15 including a light-emitting layer: Multiple quantum well structure
Quantum well layer: AlInGaN
Barrier layer: GaN
Second n-type layer 14: n-AlGaN:Si
Reflecting layer 70: Periodic structure
First reflecting layer 71: n-Al$_{0.1}$Ga$_{0.9}$N:Si
Second reflecting layer 72: n-Al$_{0.4}$Ga$_{0.6}$N:Si
Repeating number of 1st and 2nd layers: 1 to 70
First n-type layer 13: n-GaN:Si
Buffer layer 12: AlN
Substrate 11: Sapphire In the light-emitting element 60, the reflecting layer 70 has a structure alternately laminated with the first reflecting layers 71 of n-Al$_{0.1}$Ga$_{0.9}$N of Si dope and the second reflecting layers 72 of n-Al$_{0.4}$Ga$_{0.6}$N of Si dope containing more Al than the first reflecting layer 71. It is known that the refractive index $n_1$ of the first reflecting layer 71 is larger than the refractive index $n_2$ of the second reflecting layer 72 as $n_1 > n_2$. As to the film thickness, the first layer 71 and second reflecting layer 72 are determined to be substantially equal to $\lambda/4_{n1}$ and $\lambda/4_{n2}$ with respect to the emission peak wavelength $\lambda$ in the ultraviolet region in the layer containing the light-emitting layer. By providing the reflecting layer of the above structure, the light in the ultraviolet region occured in the layer 15 including a light-emitting layer and traveling toward the side of the n-contact layer 13 is reflected by the reflecting layer 70. Since the n-contact layer 13 generally absorbs part of the light in the ultraviolet region which has a wavelength 360 nm or lower, the light in the ultraviolet region cannot be efficiently irradiated to the fluorescent material. However, by providing the reflecting layer 70, it prevents the light in the ultraviolet region from being absorbed in the n-contact layer 13, as well as the light in the ultraviolet region can be efficiently irradiated to the fluorescent material arranged in the direction toward the light-transmitting electrode 18 by reflecting the light occurred in the layer 15 including a light-emitting layer to the direction toward the light-transmitting electrode 18. Accordingly, the emission of high luminance can be obtained from the fluorescent material, so that it is possible to present a light emitting device of high emission efficiency.

Industrial Applicability

For the material of the reflecting layer 70, $Al_xGa_{1-x}N$ ($0 \leq x \leq 1$) is employed, but the Group III nitride compound semiconductors represented by a general formula of $Al_xGa_yIn_{1-x-y}N$ ($0 \leq x \leq 1$, $0 \leq y \leq 1$, $0 \leq x+y \leq 1$) may be used. In addition, the reflecting layer may be formed by a semiconductor such as $Si_xGe_{1-x}C$ ($0 \leq x \leq 1$), $Zn_xMg_{1-x}S_ySe_{1-y}$ ($0 \leq x \leq 1$, $0 \leq y \leq 1$), and $Al_xGa_yIn_{1-x-y}As_zP_{1-z}$ ($0 \leq x \leq 1$, $0 \leq y \leq 1$, $0 \leq z \leq 1$, $0 \leq x+y \leq 1$), a metallic nitride such as titanium nitride, zirconium nitride, hafnium nitride, and tantalum nitride, a single metal selected from the group of consisting of Al, In, Cu, AgI, Pt, Ir, Pd, Rh, W, Mo, Ti, and Ni, or an alloy composed of at least two metals optionally selected from the group. Further, in this embodiment, although two kinds of layers with different refractive indexes are laminated to form a reflecting layer, the reflecting layer may be formed of one kind of a layer with a large refractive index and a large reflectivity, alternatively, may be a structure of laminating more than three kinds of layers having different refractive indexes.

Although the invention has been explained in detail with reference to the specific embodiments, it is apparent to those skilled in the art to make various alternations or modifications so far as not departing from the spirit and the scope of the invention.

The present application is based on Japanese Patent Application filed on Jan. 10, 2001 (No. 2001-003104) and Japanese Patent Application filed on Nov. 16, 2001 (No. 2001-352376), which is incorporated herein by reference.

The invention is not limited at all to the description of the mode for carrying out the invention and the description of the embodiments. The invention includes various modifications that can be conceived easily by those skilled in the art, without departing the scope of claim.

The present application discloses the following items.

There is disclosed a light-emitting element comprising a Group III nitride compound semiconductor, and has a light-emitting layer emitting light with an emission peak wavelength in an ultraviolet region and light with an emission peak wavelength in a visible region.

The emission peak wavelength of the light in the ultraviolet region can be set at 360 nm or less. Further, the emission peak wavelength of the light in the visible region can be set in a range of from 430 to 560 nm, or in a range of from 450 to 490 nm.

A light-emitting layer which has a region of $Al_{x1}Ga_{1-x1-x2}In_{x2}N$ ($0<x1<1$, $0<x2<1$, $x1>x2$) and a region of $Al_{y1}Ga_{1-y1-y2}In_{y2}N$ ($0<y1<1$, $0<y2<1$, $y1<y2$) may be adopted. In this case, the region of $Al_{x1}Ga_{1-x1-x2}In_{x2}N$ ($0<x1<1$, $0<x2<1$, $x1>x2$) and the region of $Al_{y1}Ga_{1-y1-y2}In_{y2}N$ ($0<y1<1$, $0<y2<1$, $y1<y2$) can be formed within a single layer.

In addition, a light-emitting layer which has a region of $Al_xGa_{1-x}N$ ($0 \leq x \leq 1$) and a region of $In_yGa_{1-y}N$ ($0 \leq y \leq 1$) can be adopted. In this case, a region of $Al_xGa_{1-x}N$ ($0 \leq x \leq 1$) and a region of $In_yGa_{1-y}N$ ($0 \leq y \leq 1$) can be formed within a single layer.

What is claimed is:

1. A light emitting device, comprising:
   a light-emitting element comprising a Group III nitride compound semiconductor and including a light-emitting layer emitting light with an emission peak wavelength in an ultraviolet region and light with an emission peak wavelength in a visible region; and
   a fluorescent material excited by said light in the ultraviolet region to emit light with a wavelength different from that of said excitation light,
   wherein the light-emitting layer includes a region of $Al_{x1}Ga_{1-x1-x2}In_{x2}N(0<x1<1, 0<x2<1, x1>x2)$ emitting the light in the ultraviolet region and a region of $Al_{y1}Ga_{a1-y1-y2}In_{y2}N(0<y1<1, 0<y2<1, y1<y2)$ emitting the light in the visible region.

2. A light-emitting device according to claim 1, wherein the emission peak wavelength of the light in the visible region is in a range of from 430 to 560 nm.

3. A light emitting device according to claim 2, wherein the emission peak wavelength of the light in the visible region is in a range of from 450 to 490 nm.

4. A light emitting device according to claim 1, wherein the region of $Al_{x1}Ga_{1-x1-x2}In_{x2}N(0<x1<1, 0<x2<1, x1>x2)$ and the region of $Al_{y1}Ga_{1-y1-y2}In_{y2}N(0<y1<1, 0<y2<1, y1<y2)$ are formed within a single layer.

5. A light emitting device according to claim 1, wherein the light from the light-emitting element and the light from the fluorescent material are mixed and emitted.

6. A light emitting device according to claim 1, wherein the emission peak wavelength of the light in the ultraviolet region is in a range of 360 nm or less.

7. A light emitting device, comprising:
   a light-emitting element comprising a Group III nitride compound semiconductor and including a light-emitting layer emitting light with an emission peak wavelength in an ultraviolet region and light with an emission peak wavelength in a visible region; and
   a fluorescent material excited by said light in the ultraviolet region to emit light with a wavelength different from that of said excitation light,
   wherein the light-emitting layer includes a region of $Al_xGa_{1-x}N(0 \leq x \leq 1)$ emitting the light in the ultraviolet region and a region of $In_yGa_{1-y}N$ ($0y \leq 1$) emitting the light in the visible region.

8. A light emitting device according to claim 7, wherein the region of $Al_xG_{a1-x}N(0 \leq x \leq 1)$ and the region of $In_yGa_{1-y}N$ ($0 \leq y \leq 1$) are formed within a single layer.

9. A light emitting device, comprising:
   a light-emitting element comprising a Group III nitride compound semiconductor and including a light-emitting layer emitting light with an emission peak wavelength in an ultraviolet region and light with an emission peak wavelength in a visible region; and
   a fluorescent material excited by said light in the ultraviolet region to emit light with a wavelength different from that of said excitation light,
   wherein the light emitting direction is shielded by a light transmitting material dispersed with the fluorescent material.

10. A light emitting device according to claim 9, wherein the light-emitting element is mounted on a cup portion of a lead frame, while the cup portion is filled with the light transmitting material dispersed with the fluorescent material.

* * * * *